(12) United States Patent
Wakana et al.

(10) Patent No.: US 8,873,242 B2
(45) Date of Patent: Oct. 28, 2014

(54) AUTOMOTIVE CONTROL UNIT

(75) Inventors: Yoshinori Wakana, Kasama (JP); Masaru Kamoshida, Hitachi (JP); Takeshi Igarashi, Hitachinaka (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 355 days.

(21) Appl. No.: 13/299,379

(22) Filed: Nov. 18, 2011

(65) Prior Publication Data
US 2012/0127677 A1 May 24, 2012

(30) Foreign Application Priority Data

Nov. 18, 2010 (JP) ................................. 2010-258177

(51) Int. Cl.
*H05K 5/00* (2006.01)
(52) U.S. Cl.
CPC .................................... *H05K 5/0069* (2013.01)
USPC ............ 361/752; 361/730; 361/748; 361/736
(58) Field of Classification Search
USPC .................................. 361/752, 730, 748, 736
See application file for complete search history.

(56) References Cited

U.S. PATENT DOCUMENTS

| | | | | |
|---|---|---|---|---|
| 5,533,905 A | * | 7/1996 | Hio et al. | 439/76.2 |
| 2008/0302657 A1 | * | 12/2008 | Luten et al. | 204/298.36 |

FOREIGN PATENT DOCUMENTS

| | | |
|---|---|---|
| JP | 09-092992 | 4/1997 |
| JP | 09-097652 | 4/1997 |
| JP | 2003-151676 | 5/2003 |
| JP | 2003-164040 | 6/2003 |
| JP | 2004-056836 | 2/2004 |
| JP | 2004-362928 | 12/2004 |
| JP | 2009-43606 | 2/2009 |
| JP | 2009-189175 | 8/2009 |
| JP | 2009-302039 | 12/2009 |
| JP | 2010-81669 | 4/2010 |

OTHER PUBLICATIONS

JP Office Action for Japanese Application No. 2010-258177, issued on Jan. 23, 2014.
JP Office Action for Japanese Application No. 2010-258177, issued on Apr. 30, 2014.

* cited by examiner

*Primary Examiner* — Andargie M Aychillhum
(74) *Attorney, Agent, or Firm* — Antonelli, Terry, Stout & Kraus, LLP.

(57) ABSTRACT

Automotive control unit having two connectors is provided in an uncomplicated configuration that allows holding durability to be ensured against high external force upon insertion of the connectors, watertightness in a severer environment, and high reliable connecting portions.
The automotive control unit includes a board 100 on which an electronic device is mounted; a first connector directly inserted into and attached to a device to be controlled; a second connector 200 for connecting to another control unit; and a housing which holds the board and includes a cover 130 and a case 500 to which the first and second connectors 300 and 200, respectively, are attached. The first connector 300 is configured to be secured to the housing from the outside of the housing. The second connector 200 is held by and secured onto the board and then secured to the housing from the inside of the control unit.

13 Claims, 5 Drawing Sheets

AUTOMOTIVE CONTROL UNIT

BACKGROUND OF THE INVENTION

1. Field of the Invention

The present invention relates to automotive control units and in particular to an automotive control unit having a plurality of connectors for connecting with a device to be controlled and other devices.

2. Description of the Related Art

Along with the downsizing and reduction in cost of automobiles per se, an automotive control unit is often attached directly to a device to be controlled. Further, development of coordinated control with other devices or the overall automobile has been in progress. For these reasons, the automotive control unit needs to have, in a state of direct connection with the device to be controlled, the following functions: a connection through a plurality of connectors between control units which allows the control unit to take in, from other control unit, information necessary for the device to be controlled; and a connection through a plurality of connectors which allows for associating the information taken with other devices.

The automotive control unit needs to able to firmly hold a first connector which is directly inserted into the device to be controlled; and have a second connector for connecting with other devices. In addition, to ensure a durable watertight structure for a severe environment and the higher connecting reliability for the connector portions, it is necessary to configure the automotive control unit so as not to impose the burdens on a control board provided in the automotive control unit, and connecting portions between the control board and the connectors. The automotive control unit that meets the above requirements, can be assembled, and is low in cost, is demanded.

Known examples of a connector securing mechanism include a method in which a connector is held and secured along with a housing and a board by means of a screw (see JP-2010-81669-A) and a method in which a structure for holding a connector is separately provided (see JP-2009-43606-A).

SUMMARY OF THE INVENTION

JP-2010-81669-A discloses the mechanism in which the housing and board, and the connector can firmly be secured by means of the screw. However, in the environment where watertightness is required, inflow of water to the housing is likely to happen since the screw portion is configured to pass through the housing. That is to say, in JP-2010-81669-A, the use of the mechanism under the severe environment is not taken into account.

In the mechanism disclosed in JP-2009-43606-A, when the connector is inserted into the board, external force is applied to the board in a direction where the board is turned with the connector securing portion in center, that is, a load is placed on the board so that the board is dislocated. If a higher external force is applied to the board upon inserting the connector, the connecting portion between the connector and the board could be vulnerable to such external force. Therefore, the disclosed mechanism has low reliability.

It is an object of the present invention to provide an automotive control unit including: two connectors; and an uncomplicated configuration that allows holding durability to be ensured against high external force upon insertion of the connectors. The automotive control unit ensures watertightness under the sever environment, and has connecting portions with high reliability.

According to an aspect of the present invention, there is provided an automotive control unit including: a board on which an electronic device is mounted; a first connector directly inserted into a device to be controlled upon attachment; a second connector for connecting to another control unit; and a housing which houses and holds the board therein, the first and second connectors being attached to the housing; wherein the first connector is configured to be secured to the housing from the outside of the housing, and the second connector is held by and secured onto the board and then secured to the housing from the inside of the control unit.

The automotive control unit configured as above includes two connectors and an uncomplicated configuration that ensures holding durability against high external force upon inserting the connectors. The automotive control unit ensures watertightness under the sever environment, and has connecting portions with high reliability.

In the automotive control unit described above, preferably, the first connector is connected on a side where the board faces the device to be controlled, and the second connector is connected on the rear side of a surface of the board, the surface of the board facing the device to be controlled.

In the automotive control unit described above, preferably, the second connector is integrally formed with a holding portion associated with the housing, and the holding portion is allowed to be in contact with a receiving portion provided inside the housing.

In the automotive control unit described above, preferably, a sealant is disposed on each of the first and second connectors to provide a terminal portion and a mold portion in each of the connectors with watertightness In the automotive control unit described above, preferably, the housing to which the second connector is secured is formed with a fin adapted to radiate heat produced by the board installed in the housing.

In the automotive control unit described above, preferably, a large-sized electrolytic capacitor or coil for control is disposed on the rear side of a surface of the board, the surface of the board facing the device to be controlled.

In the automotive control unit described above, preferably, an adhesive used to secure the first connector to the housing is an epoxy-based adhesive, and an adhesive used to secure the second connector to the housing is a silicon-based adhesive.

In the automotive control unit described above, preferably, the housing is provided at a position attached to the device to be controlled with a mechanism for preventing turning of the control unit when the control device is attached to the housing.

In the automotive control unit described above, preferably, the mechanism for preventing turning of the control unit is a projection which is disposed on a contact surface with the device to be controlled so as to extend toward the device to be controlled.

The present invention can provide an automotive control unit including: two connectors; and an uncomplicated configuration that ensures holding durability against high external force upon inserting the connectors. The present invention ensures watertightness under the sever environment, and has connecting portions with high reliability.

DESCRIPTION OF THE PREFERRED EMBODIMENTS

A configuration of an automotive control unit according to an embodiment of the present invention will hereinafter be described with reference to FIGS. 1-5.

The overall configuration of the automotive control unit according to the embodiment is first described with reference to FIGS. 1 and 2.

Figure 1:
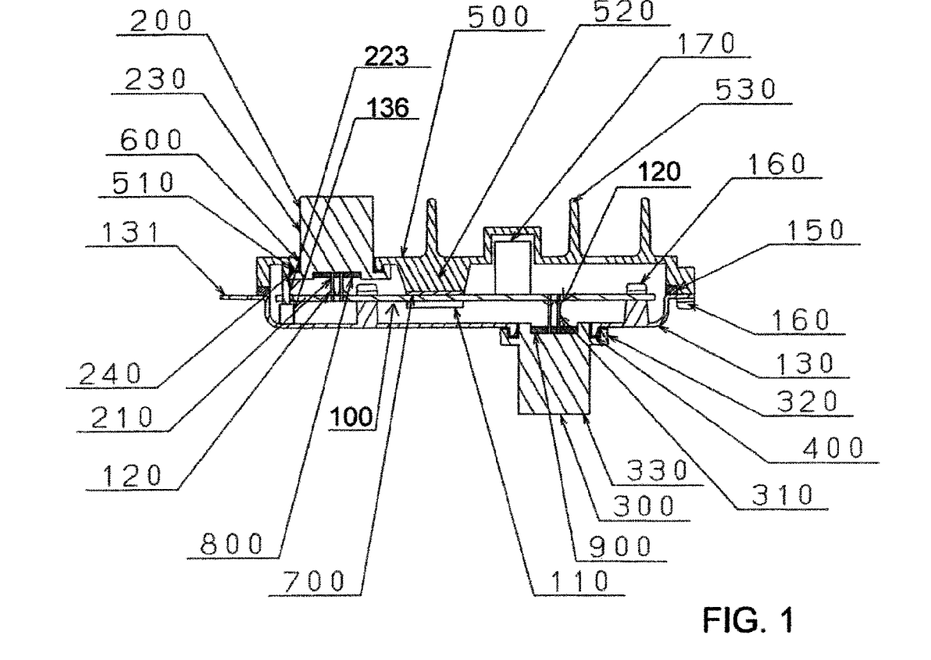
FIG. 1 is a cross-sectional view illustrating an overall configuration of an automotive control unit according to an embodiment of the present invention.

FIG. 1 is a cross-sectional view illustrating the overall configuration of the automotive control unit according to the embodiment of the present invention. FIG. 2 is an exploded view illustrating the overall configuration of the automotive control unit according to the embodiment of the present invention. Incidentally, like components to those shown in FIGS. 1 and 2 are denoted by the same reference numerals.

Referring to FIG. 1, the automotive control unit of the present invention mainly includes a board 100, a cover 130, a case 500, a first connector 300 and a second connector 200. The cover 130 and the case 500 are each formed by aluminum die casting in a cross-sectional shape as shown in the figure. The board 100 is held and secured in a space defined by joining the cover 130 and the case 500 together. The cover 130 and the case 500 form a housing for housing the board 100 therein.

The first connector 300 is directly connected to a device to be controlled not shown. The second connector 200 is used to connect the other control unit not shown. If the counterpart of the automotive control unit of the present embodiment is, e.g., a control unit for an automatic transmission, the counterpart of the device to be controlled is the automatic transmission. A connector is secured to a case of the automatic transmission. The first connector 300 is directly inserted into and connected to the connector secured to the case of the automatic transmission. The other control unit is, e.g., an engine controlling unit or the like. The engine controlling unit and the control unit for the transmission are connected to each other via a wire harness so that they can communicate with each other through CAN or the like. Connectors are attached to both ends of the wire harness and the second connector 200 is connected to one of the two connectors attached to the wire harness. Each of the first connector 300 and the second connector 200 is previously formed of a resin mold.

The board 100 is provided with a circuit including an electronic part 110 and a pattern. A terminal 210 of the second connector 200 is connected to the board 100 with solder 120. An electric part 170 such as an electrolytic capacitor, a coil or the like is attached to the board 100.

On the other hand, the first connector 300 is previously fixed to the case 130 with a waterproof and fixing adhesive 400. The board 100 is secured to the cover 130 with screws 160. The board 100 is configured to be secured to the terminal 310 of the first connector 300 with solder 120. The cover 130 and the case 500 are assembled to each other to define a space in which the board 100 is disposed. The space can ensure waterproofness due to the interposition of the waterproof adhesive 150 between the cover 130 and the case 500.

The second connector 200 is provided with a groove 240 to which an adhesive 600 is applied to bond and secure the second connector 200 to the case 500. The second connector 200 is configured to be secured to the case 500 by an adhesive portion 510 provided on the case 500 and the adhesive 600. The electronic part 110 is operated for self-heating. To transmit the heat generated by the electronic part, the case 500 is integrally provided with a heat transfer projection 520 structured to project toward the heat-generating electronic part 110 and with radiating fins 530. The electric part 110 is connected to the projection 520 and the fins 530 via a heat-transfer member 700. Thus, the case 500 is configured to have a function of transmitting and radiating the heat generated by the electronic part 110. For the heat-transfer member 700, a silicon adhesive containing metal filler is used for example.

The second connector 200 is integrally formed with a holding portion 223 associated with the cover 130. The holding portion 223 passes through a through-hole provided in the board 100 and projects from the underside of the board 100. A receiving portion 136 in contact with the holding portion 223 is provided integrally with the cover 130 at a position corresponding to the leading end of the holding portion 223. When the connector provided at one end of the wire harness connected with the other control unit is connected to the second connector 200, the force applied to the second connector 200 is received by the receiving portion 136 via the holding portion 223. This provides a structure that allows the automotive control unit to withstand external force. The holding portion 223 is configured to pass through the through-hole of the board 100; therefore, it can also be used as a positioning hole for positioning the second connector 200 with respect to the board 100.

Also the first connector 300 is provided with a groove 320 for an adhesive 400 so as to secure the cover 130. Further, the first connector 300 is configured such that a mold portion 330 is provided with the groove 320 adapted to secure and hold the first connector 300 on the board 100. In the present embodiment as described above, the first connector 300 directly inserted into the device to be controlled is configured to be secured to the housing (the cover 130) from the outside of the cover 130.

As described earlier, the first connector 300 is directly inserted into and connected to the connector secured to the case of the automatic transmission. When the first connector 300 is directly inserted into the connector secured to the case of the automatic transmission, force is applied to the first connector 300 from above in FIG. 1. When the first connector 300 is connected to the connector secured to the case of the automatic transmission, the counteracting force from the case side of the automatic transmission is transmitted from the upper end portion of the first connector 300 to the lower surface of the cover 130 and is received by the cover 130.

Thus, this configuration ensures sufficient holding ability against the large external force upon connecting.

The cover 130 is integrally formed with an attachment flange 131 on which holes are formed. After the first connector 300 has been directly inserted into and connected to the connector secured to the case of the automatic transmission, bolts are inserted into the holes of the attachment flange 131. Whereby, the automotive control unit of the present embodiment is secured to the case of the automatic transmission.

Sealant 800 is set on the second connector 200 so as to provide watertightness between the terminal 210 and the mold portion 230. Similarly, sealant 900 is set on the first connector 300 so as to provide watertightness between the terminal 310 and the mold portion 330. With regard to the fixing adhesives 400, 600 for the connectors 200, 300, and the adhesive 150 for the watertightness between the cover 130 and the case 500, the materials for those fixing adhesives and the adhesive are suitably needed to select for quality and characteristics on the basis of the nature of the solution and gas to be taken into account. For each part, either the same material or different materials can be used.

To use the same material for the fixing adhesives 400, 600, the watertight adhesive 150, the heat-transfer member 700 and the sealants 800, 900, a silicon-based adhesive can be use except the heat-transfer member 700 for which the silicon-based adhesive containing metal filler as described above is used. For the sealants 800, 900, a silicon-based adhesive for potting is used. The silicon-based adhesive for potting has the function of sealant rather than that of an adhesive.

For example, as described above if the automotive control unit of the present embodiment is the control unit for the automatic transmission and the device to be controlled is the automatic transmission, lubricant is filled inside the automatic transmission. Since there is a possibility that the lubricant may leak, an oil-resistant epoxy-based adhesive is used as the fixing adhesive 400 or the sealant 900 in order to adhere and seal between the first connector 300 and the cover 130 completely.

Figure 2:
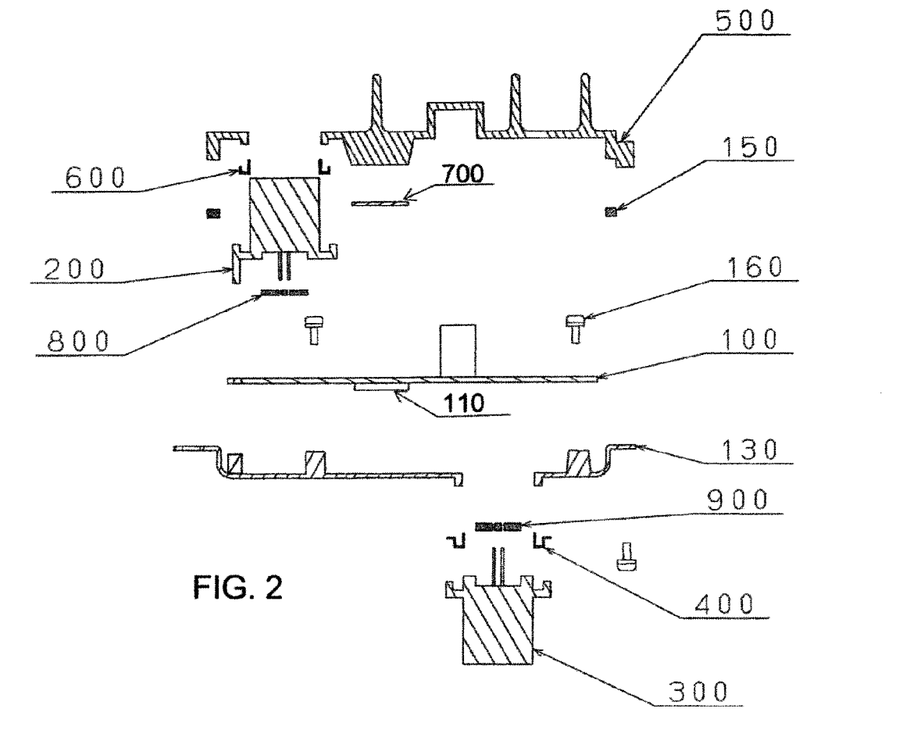
FIG. 2 is an exploded view illustrating the overall configuration of the automotive control unit according to the embodiment of the present invention.

A description is next given of an assembling process for the control unit configured as in FIG. 1 with reference to FIG. 2.

The electronic part 110 used for control is connected to the board 100 with the solder 120 and thereafter the second connector 200 is mounted onto the board 100. At this time, the second connecter 200 is mechanically secured and held by the holding portion 223 provided on the second connector 200. The sealant 800 for making the terminal portion 210 watertight is previously applied to the second connector 200. Subsequently, the terminal 210 of the second connector 200 is connected to the board 100 with the solder 120.

On the other hand, the first connector 300 is secured to and held by the cover 130 with the adhesive 400. The watertight adhesive 900 for the terminal 310 is previously applied to also the first connector 300. The board 100 is secured to the cover 130. At this time, the terminal 310 of the first connector 300 is connected to the board 100 with the solder 120.

The adhesive 600 for fixation, holding and watertightness is applied to the adhesive groove 240 to bond the second connector 200 to the case 500. The watertight adhesive 150 is applied to the cover 130. Also the heat-transfer adhesive 700 is applied onto the board 100. In this state, the case 500 is assembled and secured to the cover 130.

In this way, the adhesive, fixing and heat-transfer paths are formed among the portions or members.

As described above, the assembly order of the second connector 200 and the case 500 in the automotive control unit of the present embodiment is such that the second connector 200 is first attached to the board 100. Subsequently, the case 500 is assembled to the cover 130. If the process is reversed; the cover 130 is assembled to the case 500 and the second connector 200 is then intended to be assembled to the board 100, the second connector 200 cannot be connected to the board 100.

Accordingly, the automotive control unit of the present embodiment subjected to the assembly process as described above has the following configurational feature. The second connector 200 to be connected to the other control unit is held by and secured to the board 100 and then secured to the housing (the case 500) from the inside of the control unit.

Figure 3A:
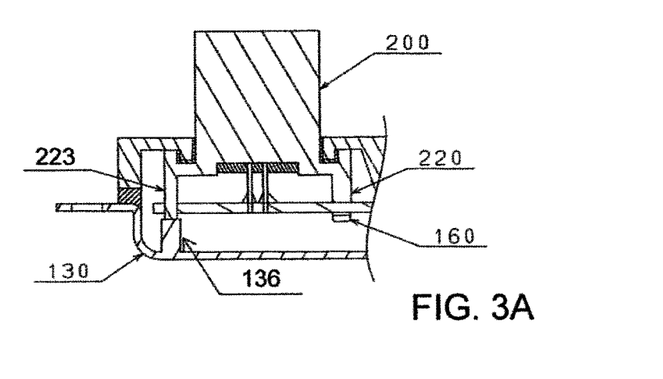
FIGS. 3A, 3B and 3C are cross-sectional views illustrating essential parts of holding portions of connectors in the automotive control unit according to the embodiment of the present invention.
Figure 3B:
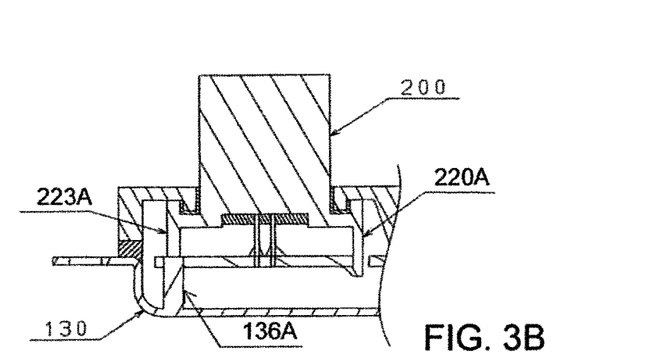
Figure 3C:
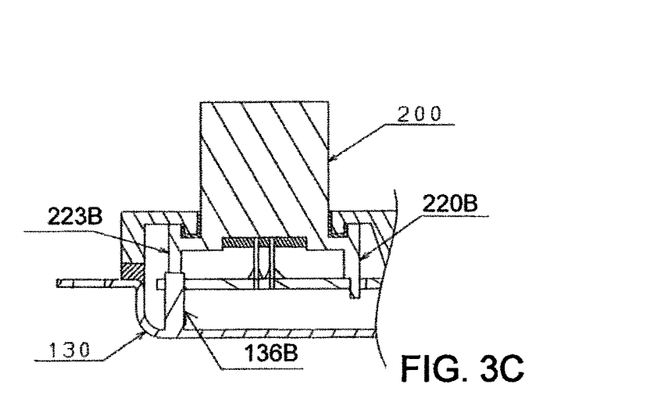

A description is next given of various configurations of the holding portion of the connector for the automotive control unit according to the present embodiment with reference to FIGS. 3A, 3B and 3C.

FIGS. 3A-3C are cross-sectional views illustrating essential parts of configurations of the holding portion of the second connector in the automotive control unit according to the embodiment of the present invention. Incidentally, the same reference numerals as those in FIGS. 1 and 2 denote the identical portions.

In an example shown in FIG. 3A, the following configuration is the same as that shown in FIG. 1. That is, the holding portion 223 is formed integrally with the second connector 200 so as to be associated with the cover 130 and the receiving portion 136 is provided integrally with the cover 130 so as to be in contact with the holding portion 223.

In addition to this, the present example is provided with a holding portion 220 which is formed integrally with the second connector 200 so as to be associated with the board 100. The holding portion 220 is secured to the board 100 by means of a screw 160. When the connector provided at one end of the wire harness to be connected with the other control unit is connected to the second connector 200, the force applied to the second connector 200 is received by the board 100 via the holding portion 220. This provides a structure that allows the automotive control unit to withstand external force.

In an example shown in FIG. 3B, a holding portion 223A formed integrally with the second connector 200 so as to be associated with the cover 130 is shorter than the holding portion 223 shown in FIG. 3A. While, a receiving portion 136A provided integrally with the cover 130 so as to be in contact with the holding portion 223A is longer than the receiving portion 136 shown in FIG. 3A and passes through a through-hole of the board 100. The holding portion 223A associated with the cover 130 is in contact with the receiving portion 136A. When the connector provided at one end of the wire harness to be connected with the other control unit is connected to the second connector 200, the force applied to the second connector 200 is received by the receiving portion 136A via the holding portion 223A. This provides a structure that allows the automotive control unit to withstand external force.

This example includes a holding portion 220A which is formed integrally with the second connector 200 so as to be associated with the board 100. The holding portion 220A is secured to the board 100 by snap-fitting. When the connector provided at one end of the wire harness to be connected with the other control unit is connected to the second connector 200, the force applied to the second connector 200 is received by the board 100 via the holding portion 220A. This provides a structure that allows the automotive control unit to withstand external force.

In an example shown in FIG. 3C, a holding portion 223B formed integrally with the second connector 200 to be associated with the cover 130 is shorter than that shown in FIG. 3B. While, a receiving portion 136B formed integrally with the cover 130 and in contact with the holding portion 223B is longer than that shown in FIG. 3B, passes through a through-hole of the board 100 and projects upward through the board 100. The holding portion 223B associated with cover 130 is in contact with the receiving portion 136B. When the connector provided at one end of the wire harness to be connected with the other control unit is connected to the second connector 200, the force applied to the connector second 200 is received by the receiving portion 136B via the holding portion 223B. This provides a structure that allows the automotive control unit to withstand external force.

This example includes a holding portion 220B which is formed integrally with the second connector 200 to be associated with the board 100. The holding portion 220B is secured to the board 100 by press-fitting. When the connector provided at one end of the wire harness to be connected with the other control unit is connected to the second connector 200, the force applied to the second connector 200 is received by the board 100 via the holding portion 220B. This provides a structure that allows the automotive control unit to withstand external force.

Figure 4:
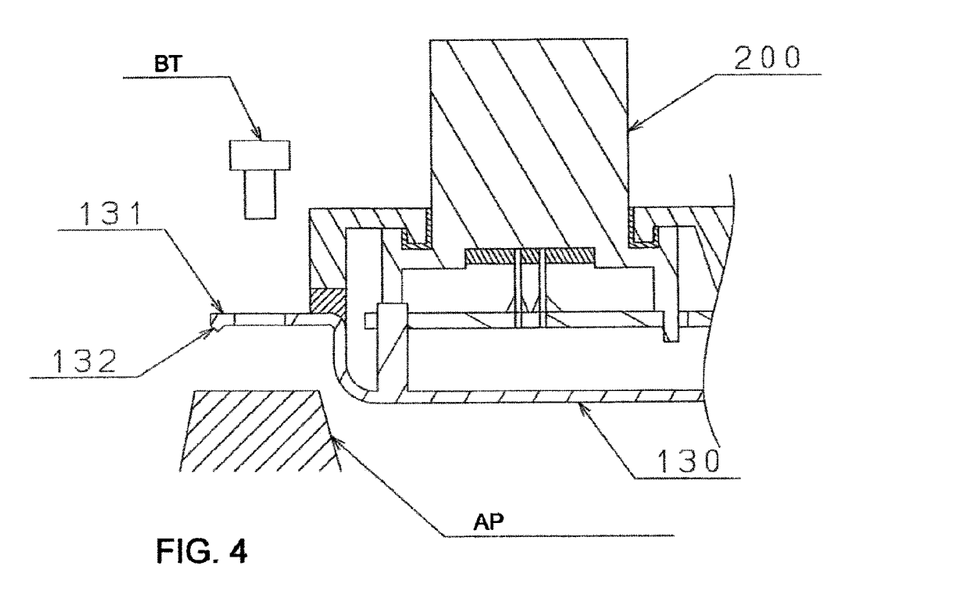
FIG. 4 is an enlarged cross-sectional view illustrating an essential part of a positioning mechanism used in the automotive control unit according to the embodiment of the present invention.

A description is next given of a positioning mechanism used in the automotive control unit according to the embodiment of the present invention with reference to FIG. 4.

FIG. 4 is an enlarged cross-sectional view illustrating an essential part of the positioning mechanism used in the automotive control unit according to the embodiment of the present invention. Incidentally, the same reference numerals as those in FIGS. 1-3 denote identical portions.

When the control unit of the present embodiment is attached to the device to be controlled (e.g. the automatic transmission), the first connector 300 shown in FIG. 1 is fitted to the counterpart connector provided on the device to be controlled. Thereafter, the control unit of the present embodiment is secured to the device to be controlled by means of bolts BT or the like.

When the bolt BT is tightened, if the head of the bolt BT comes into contact with the attachment flange 131 of the cover 130, the control unit of the present embodiment is turned by the turning force for fastening the bolt BT. Consequently, the turning force may be transmitted to the first connector 300 causing poor contact between the first connector 300 shown in FIG. 1 and the counterpart connector installed on the device to be controlled.

To eliminate such poor contact, the attachment flange 131 is integrally provided with a projection 132 in the present embodiment. The projection 132 cuts into an attachment portion AP of the device to be controlled. Thus, the control unit of the present embodiment can be prevented from being turned when it is secured by means of the bolt or the like.

A description is next given of other examples of the positioning mechanism used in the automotive control unit according to the embodiment of the present invention with reference to FIGS. 5A, 5B, 6A, 6B and 7.

Figures 5A, 5B:
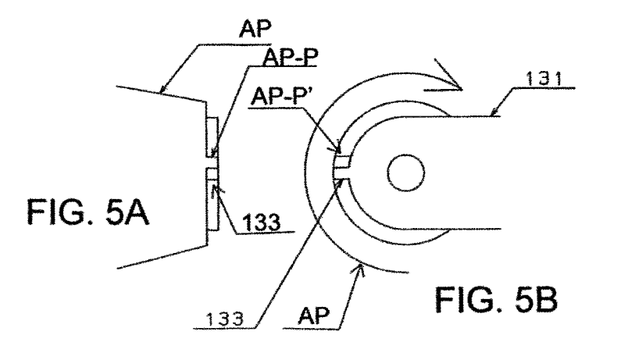
FIGS. 5A and 5B are enlarged cross-sectional views illustrating an essential part of another example of the positioning mechanism used in the automotive control unit according to the embodiment of the present invention.

FIGS. 5A-7 are enlarged cross-sectional views illustrating essential parts of the other examples of the positioning mechanism used in the automotive control unit according to the present invention. Incidentally, the same reference numerals as those in FIGS. 1-4 denote identical portions. FIG. 5A is a left lateral view and FIG. 5B is a plan view. FIG. 6A is a left lateral view and FIG. 6B is a plan view.

Referring to FIG. 5A and 5B, a first example is such that the attachment flange 131 is provided with a projecting portion 133. When the control unit is shifted in the turning direction, the projecting portion 133 comes into engagement with a projecting portion AP-P of a device AP, whereby the turning of the control unit is prevented.

Figures 6A, 6B:
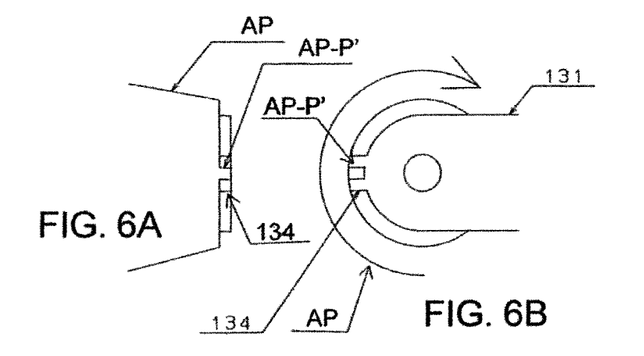
FIGS. 6A and 6B are enlarged cross-sectional views illustrating an essential part of another example of the positioning mechanism used in the automotive control unit according to the embodiment of the present invention.

Referring to FIGS. 6A and 6B, a second example is such that the attachment flange 131 is provided with a recessed portion 134 on the control unit side. The recessed portion 134 is engaged with a projecting portion AP-P' of the device AP, whereby the turning of the control unit is prevented.

Figure 7:
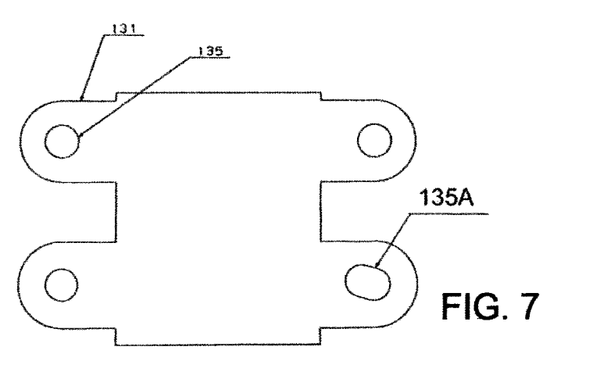
FIG. 7 is an enlarged cross-sectional view illustrating an essential part of another example of the positioning mechanism used in the automotive control unit according to the embodiment of the present invention.

Referring to FIG. 7, in a third example, the attachment flange 131 with the bolt insertion holes 135 is manufactured with a high degree of accuracy. At least two bolt insertion holes are designed to prevent the turning of the control unit. One of the two bolt insertion holes is formed in circular shape to have a small clearance with respect to a bolt to be attached thereto and the other hole of 135A is formed in an elongated shape.

The embodiments described above can provide the automotive control unit that can be connected to the device to be controlled directly with the simple configuration and further to the other control unit. According to the present embodiments, high watertightness can be achieved, as well as a burden on the connecting portion and the board is reduced, therefore enhancing reliability of the automotive control unit.

What is claimed is:

1. An automotive control unit having waterproof structure, comprising:
a board on which an electronic device is mounted;
a first connector directly inserted into a device to be controlled upon attachment;
a second connector for connecting to another control unit; and
a housing which houses and holds the board therein, the first and second connectors being attached to the housing;
wherein the first connector is configured to be secured to the housing from the outside of the housing, and
the second connector is held by and secured onto the board and then secured to the housing from the inside of the control unit;
a hole into which an end of the first connector is inserted into the housing and a protrusion protruding toward outside of the housing around the hole, are formed with the housing;
a groove facing the protrusion is formed on an end of the first connector on a housing-side of the first connector; and
the protrusion formed with the housing fits the groove formed on the first connector.

2. The automotive control unit according to claim 1, wherein the first connector is connected on a side where the board faces the device to be controlled, and
the second connector is connected on the rear side of a surface of the board, the surface of the board facing the device to be controlled.

3. The automotive control unit according to claim 1, wherein the second connector is integrally formed with a holding portion associated with the housing, and
the holding portion is in contact with a receiving portion provided inside the housing on the first connector-side through a hole of the board.

4. The automotive control unit according to claim 1, wherein a sealant is disposed on each of the first and second connectors to provide a terminal portion and a mold portion in each of the connectors with watertightness.

5. The automotive control unit according to claim 1, wherein the housing to which the second connector is secured is formed with a fin adapted to radiate heat produced by the board installed in the housing.

6. The automotive control unit according to claim 1,
wherein a large-sized electrolytic capacitor or coil for control is disposed on the rear side of a surface of the board, the surface of the board facing the device to be controlled.

7. The automotive control unit according to claim 1,
wherein an adhesive used to secure the first connector to the housing is an epoxy-based adhesive, and
an adhesive used to secure the second connector to the housing is a silicon-based adhesive.

8. The automotive control unit according to claim 1,
wherein the housing is provided at a position attached to the device to be controlled with a mechanism for preventing turning of the control unit when the control unit is attached to the housing.

9. The automotive control unit according to claim 8,
wherein the mechanism for preventing turning of the control unit is a projection which is disposed on a contact surface with the device to be controlled so as to extend toward the device to be controlled; and
the projection cuts into the device to be controlled.

10. An automotive control unit having waterproof structure, comprising:
a board on which an electronic device is mounted;
a first connector provided on a first side of the automotive control unit, and directly inserted into a device to be controlled upon attachment;
a second connector provided on a differing side of the automotive control unit than the first side, for connecting to another control unit; and
a housing which houses and holds the board therein, the first and second connectors being attached to the housing;
wherein the first connector is configured to be secured to the housing from the outside of the housing, and
the second connector is held by and secured onto the board and then secured to the housing from the inside of the control unit;
a hole into which an end of the first connector is inserted into the housing and a protrusion protruding toward outside of the housing around the hole, are formed with the housing;
a groove facing the protrusion is formed on an end of the first connector on a housing-side of the first connector; and
the protrusion formed with the housing fits the groove formed on the first connector.

11. The automotive control unit according to claim 10,
wherein the differing side is an opposite side of the automotive control unit, which is opposite to the first side.

12. An automotive control unit having waterproof structure, comprising:
a board on which an electronic device is mounted;
a first connector provided on a first side of the automotive control unit, and directly inserted into a device to be controlled upon attachment;
a second connector provided on a differing side of the automotive control unit than the first side, for connecting to another control unit; and
a housing which houses and holds the board therein, the first and second connectors being attached to the housing;
wherein the first connector is configured to be secured to the housing from the outside of the housing, and to at least partially extend through the housing, and
the second connector is held by and secured onto the board and then secured to the housing from the inside of the control unit, to at least partially extend through the housing;
a hole into which an end of the first connector is inserted to at least partially extend through the housing and a protrusion protruding toward outside of the housing around the hole, are formed with the housing;
a groove interfaceable with the protrusion is formed on an end of the first connector on a housing-side of the first connector; and
the protrusion formed with the housing fits the groove formed on the first connector.

13. The automotive control unit according to claim 12,
wherein the differing side is an opposite side of the automotive control unit, which is opposite to the first side.

* * * * *